United States Patent [19]

Yamazaki

[11] Patent Number: 4,926,069
[45] Date of Patent: May 15, 1990

[54] BI-MOS CIRCUIT CAPABLE OF HIGH SPEED OPERATION WITH LOW POWER CONSUMPTION

[75] Inventor: Toru Yamazaki, Tokyo, Japan

[73] Assignee: NEC Corporation, Japan

[21] Appl. No.: 233,072

[22] Filed: Aug. 17, 1988

[30] Foreign Application Priority Data

Aug. 17, 1987 [JP] Japan .................. 62-203156
Jan. 29, 1988 [JP] Japan .................. 63-20278

[51] Int. Cl.⁵ .......................................... H03K 17/04
[52] U.S. Cl. ................................ 307/446; 307/451; 307/570; 307/270
[58] Field of Search ............ 307/443, 446, 451, 454, 307/475, 570, 270, 296 R

[56] References Cited

U.S. PATENT DOCUMENTS

| 4,558,234 | 12/1985 | Suzuki et al. | 307/446 |
| 4,730,132 | 3/1988 | Watanabe et al. | 307/446 |
| 4,804,868 | 2/1989 | Masuda et al. | 307/570 X |
| 4,808,850 | 2/1989 | Masuda et al. | 307/570 X |
| 4,816,705 | 3/1989 | Ohba et al. | 307/570 X |

OTHER PUBLICATIONS

"NEC Research and Development", No. 84, Jan. (1987), pp. 127-130.

"VLSI Design", Aug. (1984), pp. 98-100.
"IEEE International Conference on Computer Design: VLSI in Computers", IEEE Catalog No. 84CH 2080-0, pp. 428-433.

Primary Examiner—David Hudspeth
Attorney, Agent, or Firm—Laff, Whitesel, Conte & Saret

[57] ABSTRACT

A Bi-MOS circuit includes an input terminal, an output terminal, an N-channel MOS transistor having a gate connected to the input terminal, a source connected to the ground and a drain, an NPN bipolar transistor having a collector connected to a first power voltage line, an emitter connected to the output terminal and a base connected to a drain of the N-channel MOS transistor, a load element connected between the base of the NPN bipolar transistor and a second power voltage line lower than the first power voltage line and a switching element connected between the output terminal and the ground and having a control electrode connected to the input terminal, the switching element connecting the output terminal and the ground when a first level of input signal turning the N-channel MOS transistor on is inputted to the input terminal and disconnecting the output terminal from the ground when a second level of the input signal turning the N-channel MOS transistor off is inputted to the input terminal.

8 Claims, 10 Drawing Sheets

BI-MOS CIRCUIT CAPABLE OF HIGH SPEED OPERATION WITH LOW POWER CONSUMPTION

BACKGROUND OF THE INVENTION

1. Field of the Invention

The present invention relates to a Bi-MOS circuit and, more particularly, to a Bi-MOS circuit suitable for large-scale integrated circuits (hereinafter, referred to LSI's) such as gate arrays, memories and logic IC's.

2. Description of the Related Art

In order to improve LSI's with respect to a operation speed and an output power, many efforts have been made to combine bipolar transistors and metal-oxide-semiconductor field-effect transistors (MOSFET), as disclosed in "NEC Research and Development", No. 84, January (1987), pp. 127~130 and "VLSI DESIGN", August (1984), pp. 98~100.

However, as the demand for more integrated density has been increased, the composed elements must be miniaturized. If the miniaturized MOSFETs have a channel length shorter than 0.8 μm, the hot carrier injection and the lowered withstand voltage between source and drain become new problems. Those problem may be overcome by lowering power voltage. The low power voltage decreases power dissipation to improve the integration density with the same total power consumption. The low power voltage, however, deteriorates high speed operation and driving ability.

In order to resolve the aforementioned problems, it has been proposed to add input and output signal level converting stages and applying a lowered power voltage to a signal processing part between the input and output signal level converting stages. The lowered power voltage was generated by incorporating a voltage converter formed in the same semiconductor chip. The signal processing part was formed of a combination of a large number of fundamental circuits, that is, for example, basic cells in a gate-array device. The fundamental circuit cells were formed of Bi-MOS circuits for high speed operation.

However, a large number of fundamental circuits were often operated simultaneously to cause a large quantity of transient currents. To supply such large quantity of transient current, the voltage converter must be designed by using large size transistors and requires an extremely large area to lower the integration density. Moreover, the voltage converter requires a coupling capacitor to avoid undesired oscillation. The capacitor, however, occupies a large area to further decrease the integrated density. Furthermore, the driving ability of the bipolar circuit was not improved by the lowered power voltage.

SUMMARY OF THE INVENTION

It is, therefore, a major object of the present invention to provide a Bi-MOS circuit capable of high speed operation with low power consumption.

The Bi-MOS circuit in accordance with the present invention includes a field effect transistor having a gate connected to an input terminal, one of a source and a drain connected to a first fixed potential and the other of the source and the drain, a bipolar transistor having a collector connected to a second fixed potential, an emitter connected to an output terminal and a base, a load element having a first terminal connected to both the other of the source and the drain of the field effect transistor and the base of the bipolar transistor and a second terminal connected to a third fixed potential having a potential value between the first and second fixed potential, and a switching element having a control electrode connected to both the input terminal and the gate of the field effect transistor, a third terminal connected to the first fixed potential and a fourth terminal connected to both the emitter of the bipolar transistor and the output terminal, the switching element connecting the third terminal to the fourth terminal when a first input signal which turns the field effect transistor on is inputted to the input terminal and disconnecting the third terminal from the fourth terminal when a second input signal which turns the field effect transistor off is inputted to the input terminal.

The field effect transistor is favorably an N-channel MOS transistor and the bipolar transistor is favorably an NPN transistor. In this case, the first fixed potential is a reference potential, the third fixed potential is fixed higher than the first fixed potential and the second fixed potential is fixed higher than the third fixed potential.

When the input signal is at a low level, both the N-channel MOS transistor and the switching element are turned off and the bipolar transistor is turned on. The voltage level of the output terminal is determined by the third fixed potential, the third fixed potential being lower than the second fixed potential. Therefore, the amplitude from on state to off state at the output terminal becomes small and the power consumption at the transient time becomes small. Additionally, since the collector of the bipolar transistor is connected to the second fixed potential which is higher than the third fixed potential, the collector-emitter saturation voltage $V_{CE}$ sat. is high. Therefore, the cut-off frequency $f_T$ is high and the collector current $I_C$ is large, resulting in a high speed operation and a large driving ability.

When the input signal is at a high level, both the N-channel MOS transistor and the switching element is turned on and the bipolar transistor is turned off, resulting in the low level at the output terminal. The charges in the base of the bipolar transistor are discharged rapidly by the N-channel MOS transistor, resulting in a high speed operation.

The load element is favorably a P-channel MOS transistor to form a complementary MOS circuit with the N-channel MOS transistor. The power consumption is extremely small because of the C-MOS circuit configuration. The load element may be a resistor or a load MOS transistor of which the gate is connected to the one of the source and drain of the field effect transistor.

The switching element is favorably constituted of an NPN bipolar transistor having a collector connected to the output terminal, an emitter connected to the first fixed potential and a base, an N-channel MOS transistor having one of a source and a drain connected to both the output terminal and the collector of this another NPN bipolar transistor, the other of the source and the drain connected to the base of this another NPN bipolar transistor and a gate electrode connected to the input terminal and a resistor connected between the first fixed potential and the connecting point between the other of the source and the drain of the N-channel MOS transistor and the base of this NPN bipolar transistor. The resistor may be replaced with an N-channel MOS transistor. The switching element is also favorably an N-channel MOS transistor having one of a source and a drain connected to the output terminal, the other of the source and the drain connected to the first fixed potential and a gate electrode connected to the input terminal.

The bipolar transistor may be a PNP transistor, the field effect transistor being a P-channel MOS transistor, the third fixed potential being lower than the first fixed potential and the second fixed potential being lower than the third fixed potential. The low power consumption and the high speed operation can be obtained also in this case.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS (1st embodiment)

Figure 1:
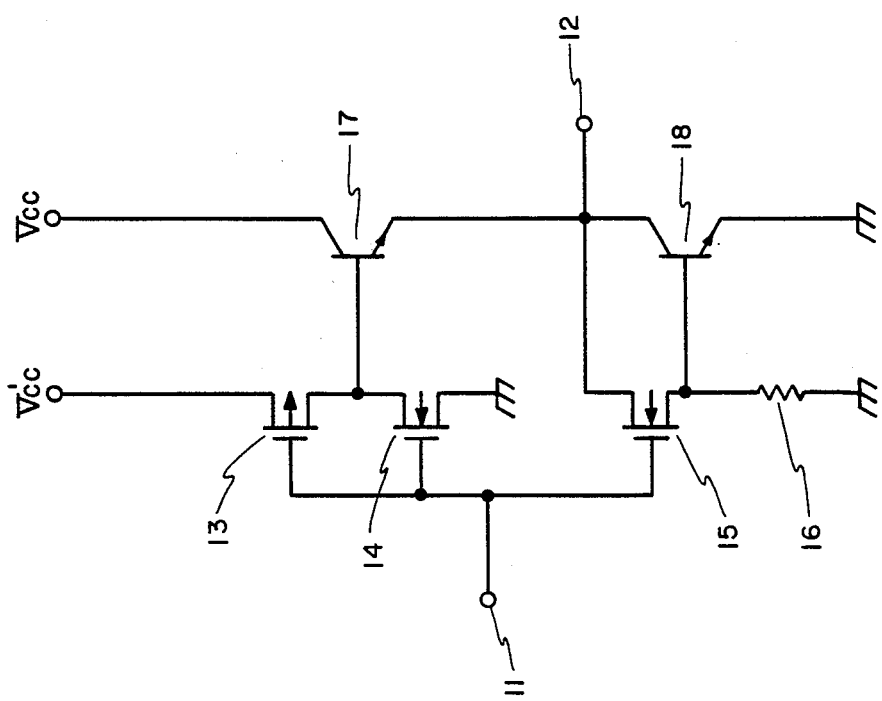
FIG. 1 is a circuit diagram of a Bi-CMOS inverter circuit of a first embodiment in accordance with the present invention.

Referring to FIG. 1, an NPN bipolar transistor 17 and an NPN bipolar transistor 18 are connected in series between a high power source Vcc and the ground. A collector of the bipolar transistor 17 is connected to the high power source Vcc, an emitter being connected to collector of the transistor 18 and an output terminal 12. An emitter of the transistor 18 is connected to the ground.

A P-channel MOS transistor 13 and an N-channel MOS transistor 14 are connected in series between a low power source V'cc which is lower than the high power source Vcc and the ground, each gate of these MOS transistor 13 and 14 being connected in common to an input terminal 11. A source of the P-channel MOS transistor 13 is connected to the lower power source V'cc, a drain being connected to a base of the NPN transistor 17 and a drain of the N-channel MOS transistor 14. A source of the N-channel MOS transistor 14 is connected to the ground. A drain of an N-channel MOS transistor 15 is connected to the output terminal 12, a gate being connected to the input terminal 11 and a source being connected not only to the ground through a resistor 16 but also to a base of the NPN transistor 18.

In the steady state when the input terminal 11 is at a high level, the N-channel MOS transistors 14 and 15 and the NPN transistor 18 are on, the P-channel MOS transistor 13 and the NPN transistor 17 being off to make the output terminal 12 be at a low level. When the input terminal 11 is at a low level, the N-channel MOS transistors 14 and 15 and the NPN transistor 18 are off, the P-channel MOS transistor 13 and the NPN transistor 17 being on to make the output terminal 12 be at a high level. Therefore, the NPN transistors 17 and 18 are not simultaneously in the "on" states not to consume power in the steady state.

When the input terminal 11 is changed from the high level to the low level, the N-channel MOS transistor 15 turns off and the charges stored in the base of the NPN transistor 18 are discharged quickly through the resistor 16. Therefore, the NPN transistor 18 turns off quickly to make all the current from the NPN transistor 17 flow into the load (not shown) connected to the output terminal 12. On the other hand, the P-channel MOS transistor 13 turns on to make the N-channel MOS transistor 14 turn off, causing the NPN transistor 17 to turn on quickly. As a result, a high level signal is produced at the output terminal 12.

According to this first embodiment of FIG. 1, the source of the P-channel MOS transistor 13 is connected to the low power source V'cc (which is lower than the high power source Vcc) and thus the high level voltage at the output terminal 12 becomes $V'cc - V_{BE}$ (where $V_{BE}$ is the built-in voltage between the base and emitter of the NPN transistor 17), resulting in the small change from "on" state to "off" state at the output terminal 12. Here, since a power is consumed in proportional to the square of the voltage change, the power consumption at the transient time becomes small. Moreover, since the collector of the NPN transistor 17 is connected to the high power source Vcc which is higher than the low power source V'cc, the collector-emitter saturation voltage $V_{CE}$ sat. of the NPN transistor 17 remains large. Accordingly, the cut-off frequency $f_T$ keeps high and a large collector current $I_C$ may be supplied, resulting in a high speed operation and a large driving ability.

When the input terminal is changed from the low level to the high level, the P-channel transistor 13 turns off, the N-channel MOS transistor 14 turning on to quickly discharge charges stored in the base of the NPN transistor 17 through the N-channel MOS transistor 14, resulting in an "off" state of the NPN transistor 17. The N-channel MOS transistor 15 turns on and a part of the current flowing through the N-channel MOS transistor 15 to the ground is bypassed through the base of the NPN transistor 18 to turn on the NPN transistor 18 quickly. Accordingly, the output terminal 12 is changed from a high level to a low level.

As described above, the charges stored in the base of the NPN transistor 17 and the NPN transistor 18 during their "on" states are discharged quickly by the N-channel transistor 14 and the resistor 16, respectively. The NPN transistor 18 is quickly turned on by the N-channel transistor 15 and the resistor 16. Consequently, the current flowing through both the NPN transistor 17 and the NPN transistor 18 at the transient time is suppressed and the power consumption at the transient time is remarkably reduced.

The high power source Vcc is favorably supplied from outside the chip, the voltage of the high power source Vcc being ordinarily 5 V. The low power source V'cc is favorably supplied by converting the voltage supplied from the high power source Vcc with use of an internal voltage converter or a voltage regulator to a voltage of 3.3 V, ordinarily. In a case of 3.3 V of the low power supply V'cc, since the base-emitter built-in voltage $V_{BE}$ is about 0.7 V, the high level at the output terminal 12 is about 2.6 V. The voltage of low power supply V'cc may be 4.0 V to raise the high level at the output terminal 12 to 3.3 V.

(2nd embodiment)

Figure 2:
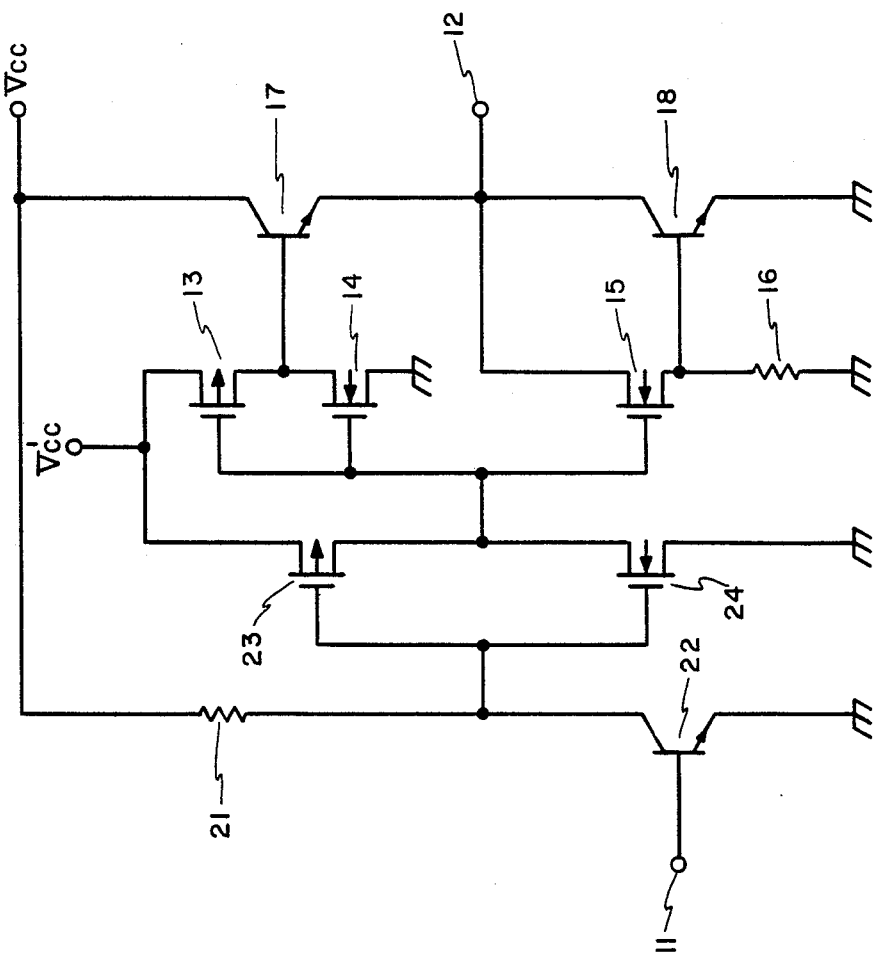
FIG. 2 is a circuit diagram of a Bi-CMOS circuit of a second embodiment in accordance with the present invention.

Referring to FIG. 2, a P-channel MOS transistor 23 and an N-channel MOS transistor 24 are connected in series between the power source V'cc and the ground. A source of the P-channel MOS transistor 23 is connected to the power source V'cc, a drain of the P-channel transistor 23 being connected to both a drain of the N-channel transistor 24 and the gates of the MOS transistors 13, 14 and 15. A source of the N-channel MOS transistor 24 is connected to the ground.

A register 21 and an NPN bipolar transistor 22 are connected in series between the high power source Vcc (which is higher than the low power source V'cc) and the ground. A collector of the NPN transistor 22 is connected not only to the high power source Vcc through the resistor 21 but also to the gates of the MOS transistors 23 and 24. A base of the NPN transistor 22 is connected to the input terminal 11, the emitter being connected to the ground. The circuit composed of the MOS transistors 13, 14 and 15, the resistor 16 and the NPN transistors 17 and 18 are the same as the first embodiment shown in FIG. 1.

When the input terminal 11 is changed to the high level, the NPN transistor 22 turns on to make the potential of its collector at the low level. Accordingly, the P-channel MOS transistor 23 turns on, the N-channel MOS transistor 24 turning off to raise the gate potential of the MOS transistors 13, 14 and 15 at a high level of V'cc which is equal to the low power source.

When the input terminal 11 is changed to the low level, the NPN transistor 22 turns off to make the potential of its collector at the high level. Accordingly, the P-channel MOS transistor 23 turns off, the N-channel MOS transistor turning on, resulting in making the gate potential of the MOS transistors 13, 14 and 15 at the low level.

Therefore, the gates of the MOS transistors 13, 14 and 15 are at the low level of ground at the input terminal 11 of high level, the gates of the MOS transistors 13, 14 and 15 being at the high level of V'cc in response to the input terminal 11 o low level. The change in amplitude from the low level to the high level at the gates of these MOS transistors 13, 14 and 15 is as small as from the ground to the V'cc (which is lower than Vcc), resulting in the low power consumption at the transient time. The circuit operation at the right-hand side of the MOS transistors 13, 14 and 15 is similar to those in FIG. 1.

Consequently, since the output terminal 12 swings between the voltage of the low power source V'cc which supplies a voltage lower than the high power source Vcc and the ground, the inverter consuming a low power can be obtained. (3rd embodiment)

Figure 3:
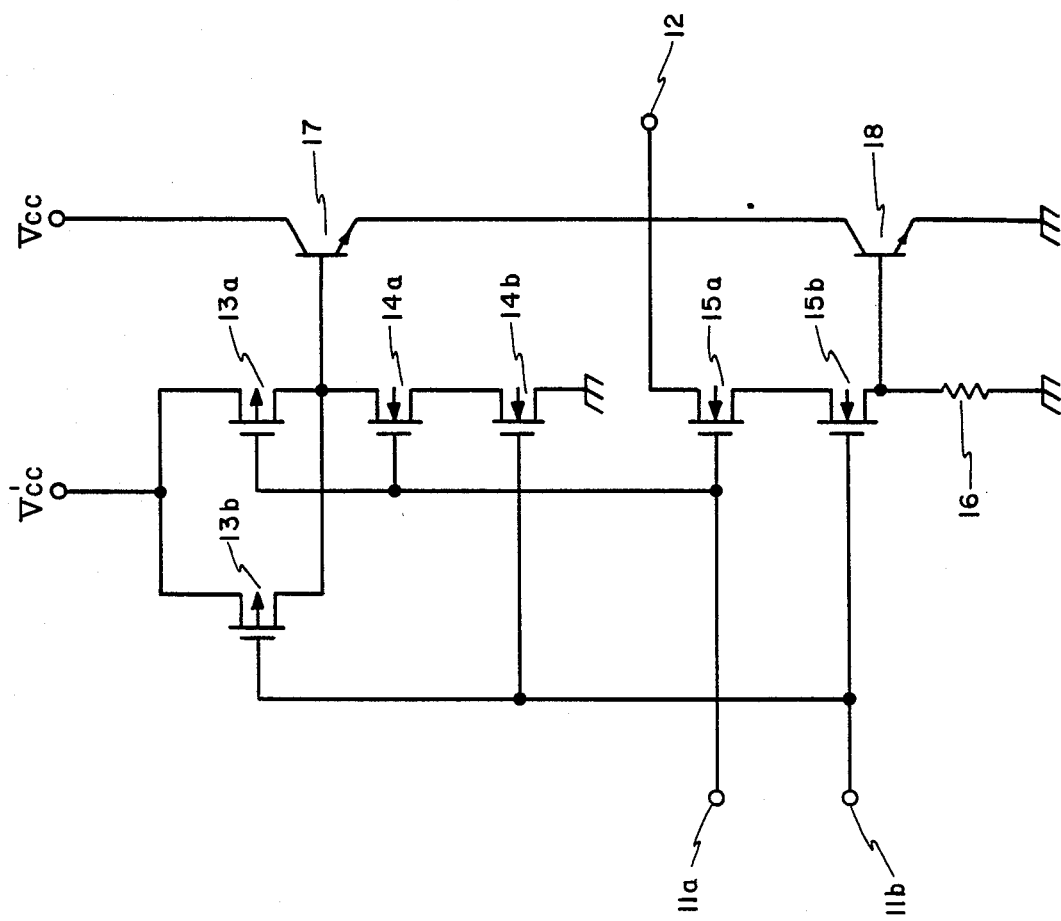
FIG. 3 is a circuit diagram of a Bi-CMOS NAND circuit of a third embodiment in accordance with the present invention.

Referring to FIG. 3, a NAND circuit having two input terminals 11a and 11b is constructed by using the inverter shown in FIG. 1. The NPN bipolar transistor 17 and the NPN bipolar transistor 18 are connected in series between the power source Vcc and the ground, the collector of the NPN bipolar transistor 17 being connected to Vcc, the emitter of the NPN transistor 17 being connected to both the output terminal 12 and the collector of the NPN transistor 18 and the emitter of the NPN transistor 18 being connected to the ground.

A P-channel MOS transistors 13a and 13b are connected in parallel, both sources of these transistors 13a and 13b being connected to the low power source V'cc which supplies a voltage lower than the high power source Vcc, both drains of these transistors 13a and 13b being connected to the base of the NPN transistor 17, a gate of the P-channel MOS transistor 13a being connected to an input terminal 1a and a gate of the P-channel MOS transistor 13b being connected to an input terminal 11b.

N-channel MOS transistors 14a and 14b are connected in series, a drain of the N-channel MOS transistor 14a being connected to the drains of the P-channel MOS transistors 13a and 13b and the base of the NPN transistor 17, a source of the N-channel MOS transistor 14a being connected a drain of the N-channel MOS transistor 14b, a source of the N-channel MOS transistor 14b being connected to the ground, a gate of the N-channel MOS transistor 14a being connected to the gate of the P-channel MOS transistor 13a and the input terminal 11a and a gate of the N-channel MOS transistor 14b being connected to the gate of the P-channel MOS transistor 13b and the input terminal 11b.

An N-channel MOS transistor 15a and an N-channel MOS transistor 15b is connected in series, a drain of the N-channel MOS transistor 15a being connected to the output terminal 12, the emitter of the NPN transistor 17 and the collector of the NPN transistor 18, a source of the N-channel MOS transistor 15a being connected to a drain of the N-channel MOS transistor 15b, a source of the N-channel MOS transistor 15b being connected to the ground by the resistor 16 and also connected to the base of the NPN transistor 18, a gate of the N-channel MOS transistor 15a being connected to the gate of the P-channel MOS transistor 13a, the gate of the N-channel MOS transistor 14a and the input terminal 11a and a gate of the N-channel MOS transistor 15b being connected to the gate of the P-channel MOS transistor 13b, the gate of the N-channel MOS transistor 14b and the input terminal 11b.

When at least one of the two input terminal 11a and 11b is changed to the low level, at least one of the two P-channel MOS transistors 13a and 13b turning on and at least one of the two N-channel MOS transistors 14a and 14b turning off to stop the current flowing through these transistors 14a and 14b, the base of the NPN transistor 17 is charged quickly by the P-channel MOS transistors 13a and 13b, resulting in a high level at the output terminal 12. At least one of the N-channel MOS transistors 15a and 15b turns off and the NPN transistor 18 turns off by discharging the charges stored in the base of this transistor 18 through the resistor 16.

When both the input terminals 11a and 11b are changed to the high level, both the P-channel MOS transistors 13a and 13b turning off, both the N-channel MOS transistors 14a and 14b turning on, the charges stored in the base of the NPN transistor 17 are discharged through the transistors 14a and 14b. Both the N-channel MOS transistors 15a and 15b turn on resulted in a quick charge into the base of the NPN transistor 18 through these N-channel MOS transistors 15a and 15b. Therefore, the output terminal 12 is quickly changed to the low level.

As described above, since the charges are charged into or discharged from the bases of the NPN bipolar transistors 17 and 18 through the MOS transistors, the bipolar transistors 17 and 18 changes quickly to avoide simultaneous "on" states, resulting in a low power consumption.

Moreover, since the sources of the P-channel transistors 13a and 13b are connected to the low power source V'cc which is lower than the high power source Vcc, the high level at the output terminal 12 is $V'cc - V_{BE}$, resulting in the small change in output level from the low level to the high level. Accordingly, the power consumption at the transient time becomes small. Furthermore, the collector of the NPN transistor 17 is connected to the high power source Vcc which is higher than the low power source V'cc and the NPN transistor 17 operates at a high speed with large driving ability as same as the inverter shown in FIG. 1.

(4th embodiment)

Figure 4:
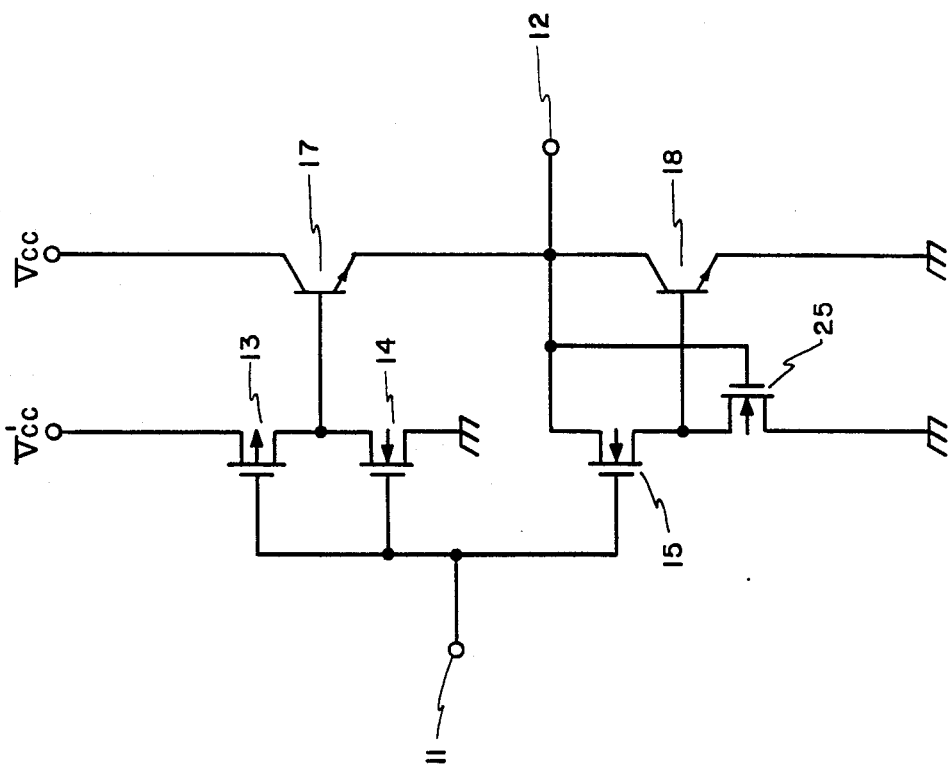
FIG. 4 is a circuit diagram of a Bi-CMOS inverter circuit of a fourth embodiment in accordance with the present invention.

Referring to FIG. 4, the resistor 16 in the inverter shown in FIG. 1 is replaced by an N-channel MOS transistor 25. The circuit operation is similar to the inverter shown in FIG. 1. The switching speed of this inverter is smaller than the inverter with the resistor 16 such as shown in FIG. 1, but the pattern layout is more simple than the inverter having the resistor 16 such as shown in FIG. 1.

(5th embodiment)

Figure 6:
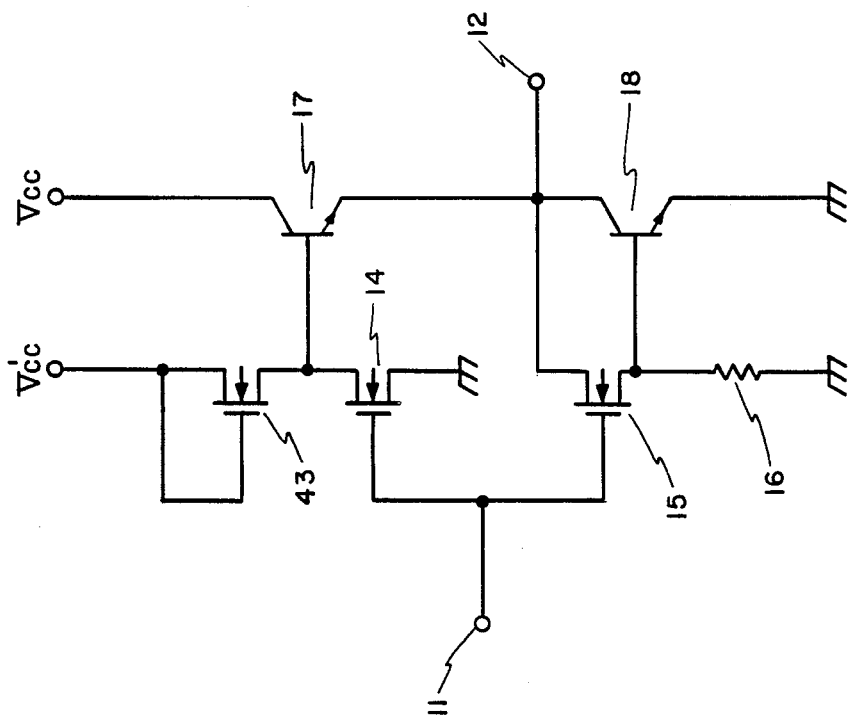
FIG. 5 and FIG. 6 are circuit diagrams of a Bi-CMOS inverter circuits of a fifth embodiment in accordance with the present invention.
Figure 5:
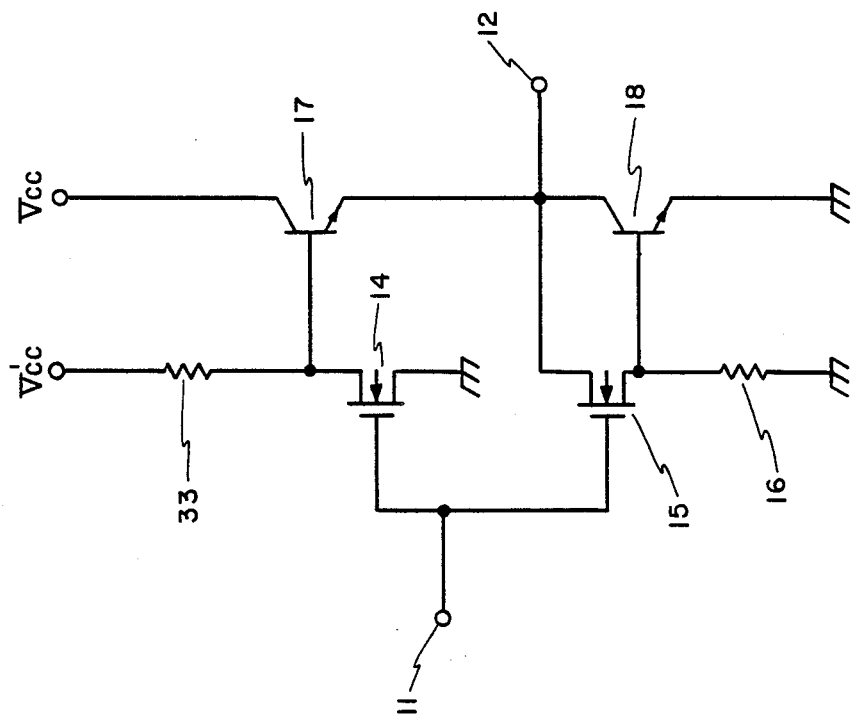

Referring to FIG. 5, the N-channel MOS transistor 13 in the inverter shown in FIG. 1 is replaced by a resistor 33. Referring to FIG. 6, the N-channel MOS transistor 13 in the inverter shown in FIG. 1 is replaced by a load MOS transistor 43. The base current always flows into the base of the NPN transistor 17 through the resistor 33 or the load MOS transistor 43 and the current flows from the power source V'cc to the ground. However, when the frequency of the signal applied to the input terminal 11 is high, for example, when higher than 100 MHz, the increase in the power consumption based on this constant base current is negligible.

(6th embodiment)

In the inverter shown in FIG. 1, the high level at the output terminal 12 is $V'cc - V_{BE}$. Since V'cc is ordinarily chosen as 3.3 V and the built-in voltage $V_{BE}$ is about 0.7 V, the high level at the output terminal 12 is 2.6 V. Additionally, the base-emitter saturation voltage $V_{BE}$ of the NPN transistor 18 is about 0.7 V and the low level at the output terminal 12 is determined by the base-emitter built-in voltage $V_{BE}$ of 0.7 V due to the "on" of the N-channel MOS transistor 15. Therefore, the change in output level from the low level to the high level at the output terminal 12 becomes as small as 1.9 V and then a noise margin becomes small. In this embodiment, in order to lower the low level at the output terminal 12 to the ground level, the switching element constructed with the N-channel transistor 15, resistor 16 and the NPN bipolar transistor 18 is replaced in a 6th embodiment shown in FIG. 7 by an N-channel MOS transistors 51.

A P-channel MOS transistor 13 and an N-channel MOS transistor 14 are connected in series to form a CMOS inverter, a source of the P-channel MOS transistor 13 being connected to a low power source V'cc which supplies a voltage lower than the high power source Vcc, a gate of the P-channel MOS transistor 13 being connected to the input terminal 11, a drain of the P-channel MOS transistor 13 being connected to a drain of the N-channel MOS transistor 14, a gate of the N-channel MOS transistor 14 being connected to the gate of the P-channel MOS transistor 13 and the input terminal 11 and a source of the N-channel MOS transistor 14 being connected to the ground. The NPN bipolar transistor 17 and an N-channel MOS transistor 51 are connected in series between the high power source Vcc and the ground, the collector of the NPN transistor 17 being connected to the high power source Vcc, the base of the NPN transistor 17 being connected to both the drains of the MOS transistors 13 and 14, an emitter of the NPN transistor 17 being connected to the output terminal 12 and a drain of the N-channel MOS transistor 51, a source of the N-channel MOS transistor being connected to the ground and a gate of the N-channel MOS transistor 51 being connected to the input terminal 11 and the gates of the MOS transistors 13 and 14.

In a steady state when the input terminal 11 is at the high level, the P-channel MOS transistor 13 and the NPN transistor 17 remain "off" states, both the N-channel MOS transistor 14 and 51 being "on" state and the output terminal 12 being at a low level. When the input terminal 11 is at the low level, the P-channel MOS transistor 13 and the NPN bipolar transistor 17 are "on" state, both the N-channel MOS transistor 14 and 51 being "off" states and the output terminal 12 being at a high level. Therefore, in the steady state, the NPN transistor 17 and the N-channel MOS transistor 51 are not simultaneously in the "on" states not to consume a power in the steady state.

When the input terminal 11 is changed from the high level to the low level, the P-channel MOS transistor 13 turns on, the N-channel MOS transistors 14 and 51 turning off. Accordingly, all the current flowing through the P-channel MOS transistor 13 flows into the base of the NPN transistor 17 to turn the transistor 17 on quickly, resulting in a high level at the output terminal 12.

When the input terminal 11 is changed from the low level to the high level, the P-channel MOS transistor 13 turns off, both the N-channel MOS transistors 14 and 51 turn on. Therefore, the charges stored in the base of the NPN transistor 17 are discharged quickly through the N-channel MOS transistor 14. Consequently, the NPN transistor 17 turns off quickly to make the output terminal 12 at a low level.

Since the source of the P-channel MOS transistor 13 is connected to the low power source V'cc (which is lower than the high power source Vcc), the high level at the output terminal 12 is $V'cc - V_{BE}$, resulting in the small change in output level at the output terminal 12 from the low level to the high level. Therefore, the power consumption at the transient time is small. Using the N-channel MOS transistor 51 in place of the bipolar transistor 18 in FIG. 1, the low level at the output terminal 12 is lowered to the ground. Accordingly, a large noise margin can be obtained although the high level at the output terminal 12 is lowered to $V'cc - V_{BE}$ Furthermore, the collector of the NPN transistor 17 is connected to the high power source Vcc which is higher than the low power source V'cc, resulting in a high speed operation and a large driving ability.

(7th embodiment)

Figure 8:
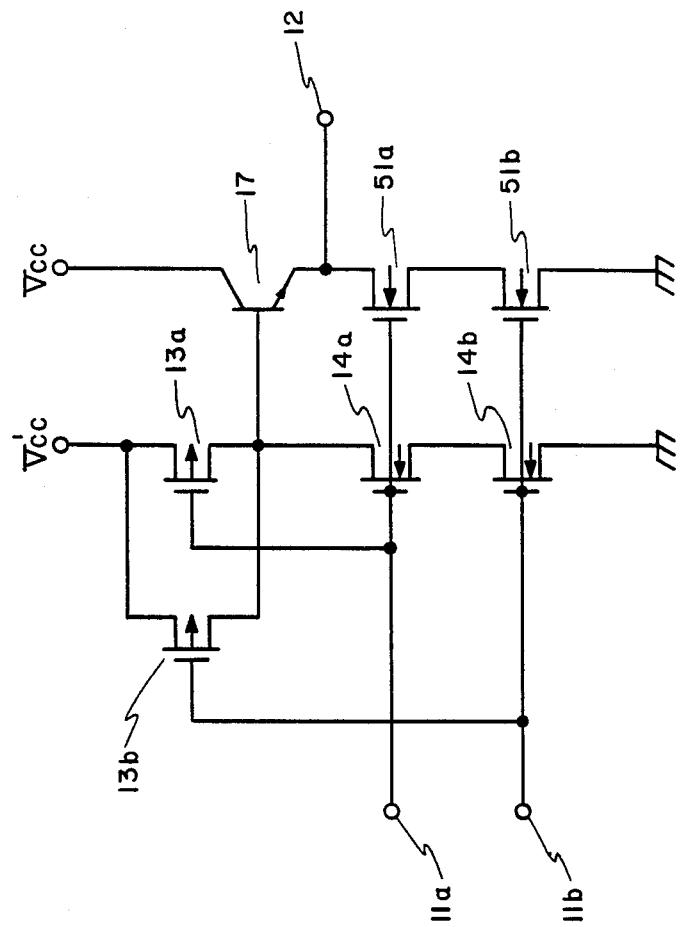
FIG. 8 is a circuit diagram of a Bi-CMOS NAND circuit of a seventh embodiment in accordance with the present invention.
Figure 7:
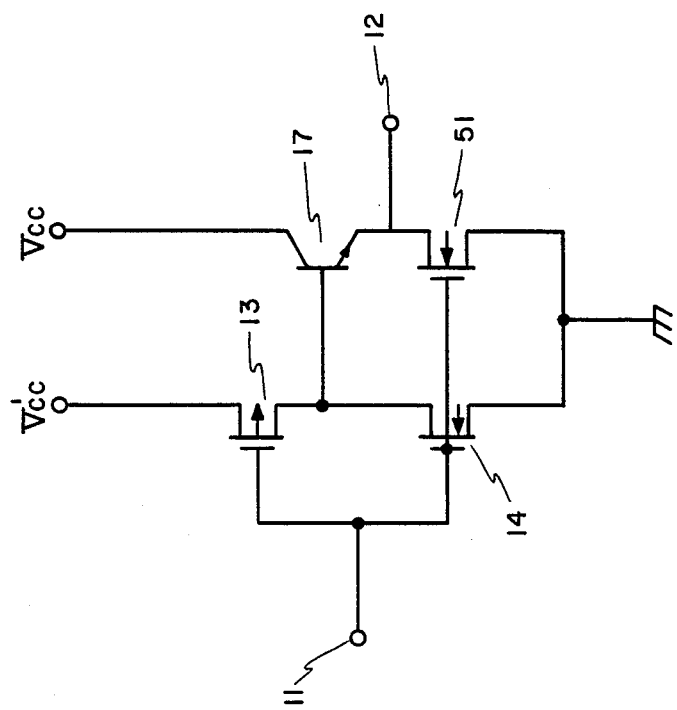
FIG. 7 is a circuit diagram of a Bi-CMOS inverter circuit of a sixth embodiment in accordance with the present invention.

Referring to FIG. 8, a NAND circuit having two input terminals 11a and 11b is constructed by utilizing the inverter shown in FIG. 7. The NPN bipolar transistor 17 and the N-channel MOS transistors 51a and 51b are connected in series between the power source Vcc and the ground, a collector of the NPN transistor 17 being connected to the high power source Vcc, an emitter of the NPN transistor 17 being connected to the output terminal 12 and a drain of the N-channel MOS transistor 51a, a gate of the N-channel MOS transistor 51a being connected to the input terminal 11a, a source of the N-channel MOS transistor 51a being connected to a drain of the N-channel MOS transistor 51b, a gate of the N-channel MOS transistor 51b being connected to the input terminal 11b and a source of the N-channel MOS transistor 51b being connected to the ground.

A P-channel MOS transistors 13a and 13b are connected in parallel with each other, both sources of these transistors 13a and 13b being connected to the low power source V'cc which is lower than the high power source Vcc, both drains of these transistors 13a and 13b being connected to the base of the NPN transistor 17, a gate of the P-channel MOS transistor 13a being connected to the input terminal 11a and a gate of the P-channel transistor 13b being connected to the input terminal 11b.

N-channel MOS transistors 14a and 14b are connected in series, a drain of the N-channel MOS transistor 14a being connected to the drains of the P-channel transistors 13a and 13b and the gate of the NPN transistor 17, a source of the N-channel MOS transistor 14a being connected to a drain of the N-channel MOS transistor 14b, a gate of the N-channel MOS transistor 14a being connected to the input terminal 11a, a gate of the N-channel MOS transistor 14b being connected to the input terminal 11b and a source of the N-channel MOS transistor 14b being connected to the ground.

When at least one of the two input terminals 11a and 11b is changed to a low level, at least one of the two P-channel MOS transistor 13a and 13b turns on, and at least one of the N-channel MOS transistors 14a and 14b turns off together with turning off of at least one of the N-channel MOS transistors 51a and 51b. Accordingly, the base of the NPN transistor 17 is charged quickly through the P-channel MOS transistors 13a and 13b, resulting in the high level at the output terminal 12.

When both the input terminal 11a and 11b are changed to the high level, both the P-channel MOS transistors 13a and 13b turn off, both the N-channel MOS transistors 14a and 14b turning on and both the N-channel MOS transistors 51a and 51b turning on. Therefore, the charges stored in the base of the NPN transistor 17 are discharged through the N-channel MOS transistors 14a and 14b, resulting in a low level at the output terminal 12.

Since the sources of the P-channel MOS transistors 13a and 13b are connected to the low power source V'cc, the high level at the output terminal 12 is as small as $V'cc - V_{BE}$, resulting in a low power consumption. Using the N-channel MOS transistors 51a and 51b in place of the bipolar transistor such as used in FIG. 1, the low level a the output terminal 12 is lowered to the ground. Therefore, a large noise margin can be maintained. Moreover, since the collector of the NPN transistor 17 is connected to the high power source Vcc, the NAND circuit can be operated at high speed with large driving ability.

(8th embodiment)

Figure 9:
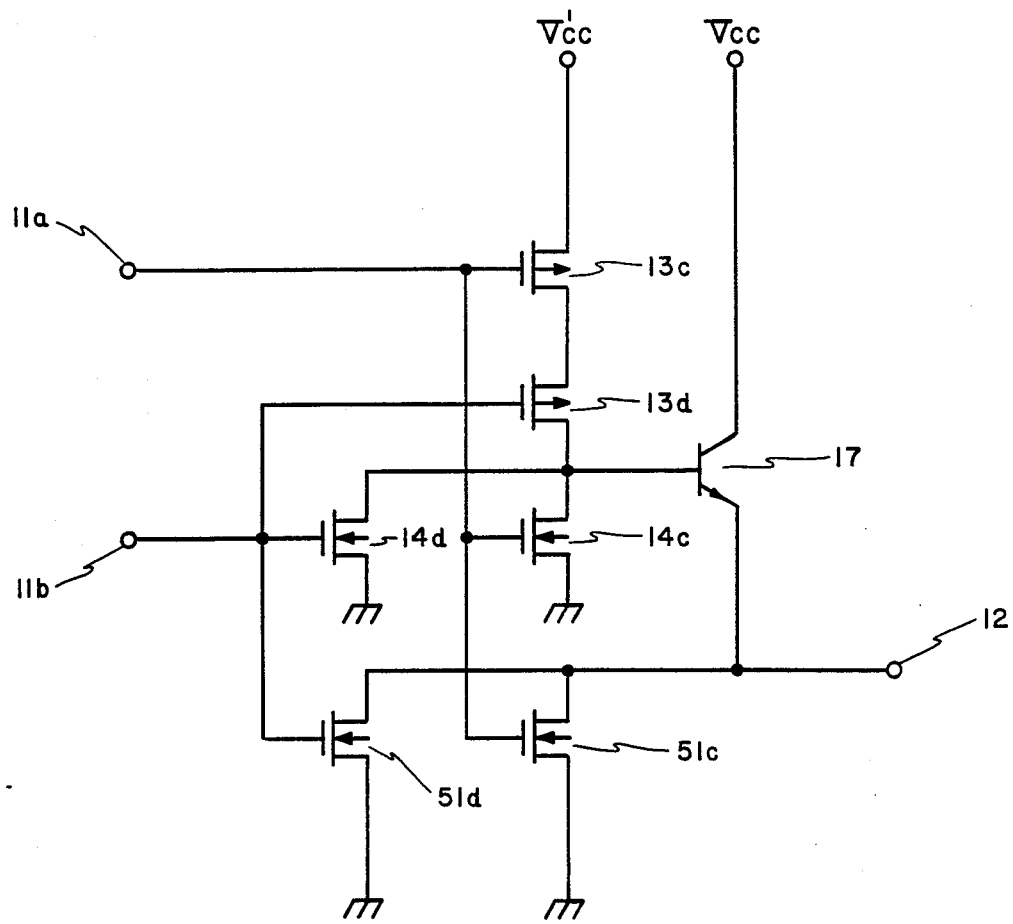
FIG. 9 is a circuit diagram of a Bi-CMOS NOR circuit of a eighth embodiment in accordance with the present invention.

Referring to FIG. 9, a NOR circuit having two input terminals 11a and 11b is constructed by utilizing the inverter shown in FIG. 7. A pair of the N-channel transistors 51c and 51d which are connected in parallel with each other and the NPN bipolar transistor 17 are connected in series between the high power source Vcc and the ground, a collector of the NPN transistor 17 being connected to the high power source Vcc, an emitter of the NPN transistor 17 being connected to the output terminal 12 and both drains of the N-channel MOS transistors 51c and 51d, both sources of the N-channel MOS transistors 51c and 51d being connected to the ground, a gate of the N-channel MOS transistor 51c being connected to the input terminal 11a and a gate of the N-channel MOS transistor 51d being connected to the input terminal 11b.

P-channel MOS transistors 13c and 13d are connected in series, a source of the P-channel MOS transistor 13c being connected to the low power source V'cc which is lower than the high power source Vcc, a drain of the P-channel MOS transistor 13c being connected to a source of the P-channel MOS transistor 13d, a drain of the P-channel MOS transistor 13d being connected to the base of the NPN transistor 17, a gate of the P-channel MOS transistor 13c being connected to the input terminal 11a and a gate of the P-channel MOS transistor 13d being connected to the input terminal 11b.

N-channel MOS transistors 14c and 14d are connected in parallel with each other, both drains of these MOS transistors 14c and 14d being connected to the drain of the P-channel MOS transistor 13d and the base of the NPN transistor 17, both sources of the N-channel MOS transistors 14c and 14d being connected to the ground, a gare of the N-channel MOS transistor 14c being connected to the input terminal 11a and a gate of the N-channel MOS transistor 14d being connected to the input terminal 11b.

When at least one of the input terminals 11a and 11b is changed to the high level, at least one of the P-channel MOS transistors 13c and 13d turns off, at least one of the N-channel MOS transistors 14c and 14d turns on and at least one of the N-channel MOS transistors 51c and 51d turns on. Accordingly, the base of the NPN transistor 17 is discharged quickly by the N-channel MOS transistors 14c and 14d, resulting in the low level at the output terminal 12.

When both the input terminal 11a and 11b are changed to the low level, both the P-channel MOS transistors 13c and 13d turn on, both the N-channel MOS transistors 14c and 14d turning off and both the N-channel MOS transistors 51c and 51d turn off. Accordingly, the base of the NPN transistor 17 is charged quickly by the P-channel MOS transistors 13c and 13d, resulting in the high level at the output terminal 12.

The sources of the P-channel MOS transistor 13c being connected to the low power source V'cc, the high level at the output terminal 12 is as small as V'cc - $V_{BE}$, resulting in the low power consumption during a transient period followed after an input change. Using the N-channel MOS transistors 51c and 51d in place of the bipolar transistor, the low level at the output terminal 12 is lowered to the ground. Therefore, a large noise margin can be similarly maintained. Moreover, since the collector of the NPN transistor 17 is connected to the high power source Vcc, the NOR circuit can be operated at high speed with large driving ability.

(9th embodiment)

Figure 10:
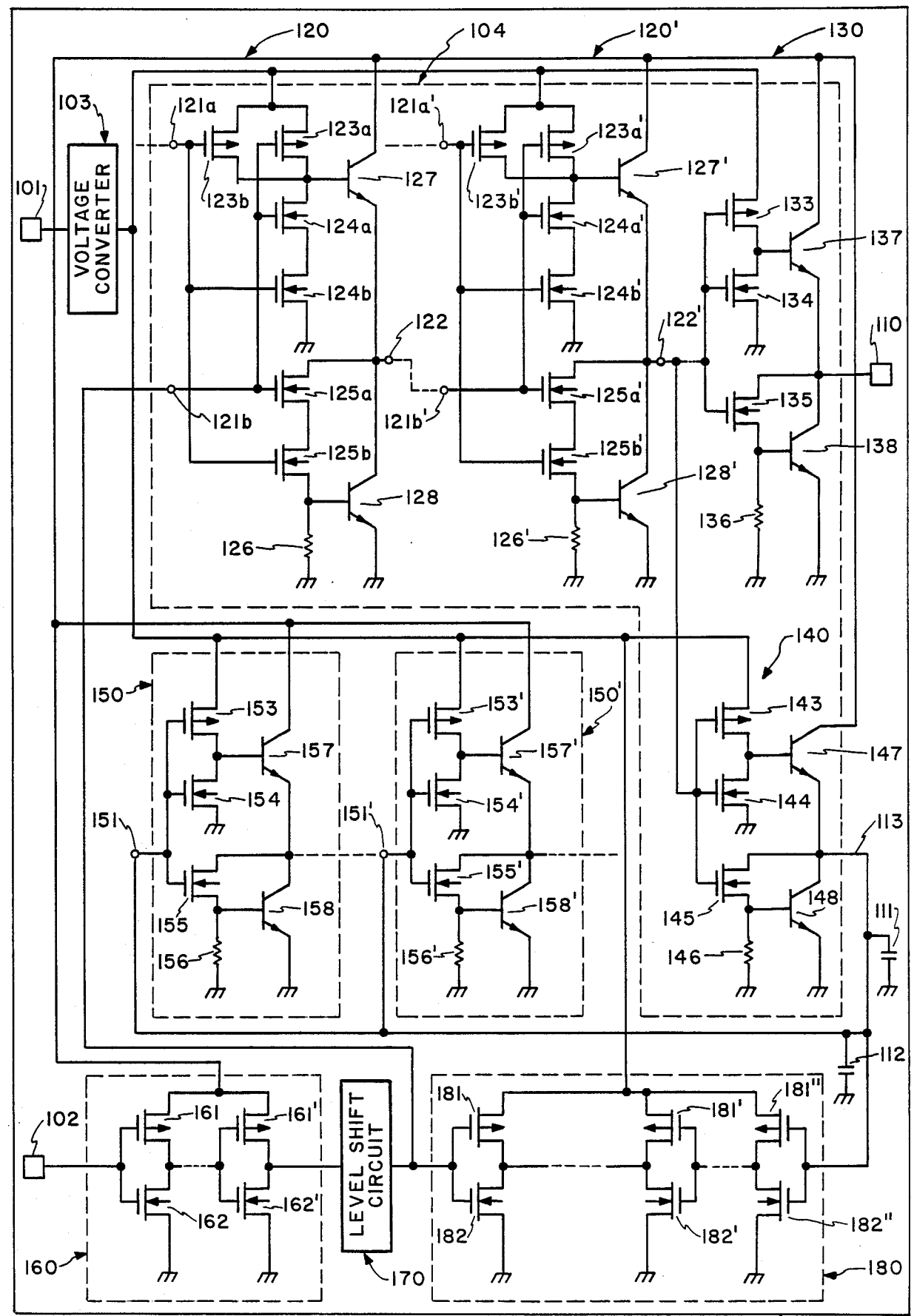
FIG. 10 is a circuit diagram of a Bi-CMOS logic IC of a ninth embodiment in accordance with the present invention.

Referring to FIG. 10, on a semiconductor pellet 190 a logic IC is constructed with an external power supply terminal 101, a signal input terminal 102, a signal output terminal 110, a voltage converter 103 which converts the external power voltage of, for example, 5 V to an internal power voltage of, for example, 3.3 V, a Bi-CMOS circuit 104 having internal gate circuits 120 and 120', an output buffer 130 and a data-bus driver 140, Bi-CMOS circuits 150 and 150', a CMOS circuit 160 having P-channel MOS transistors 161 and 161' and N-channel MOS transistors 162 and 162' and the power line being connected only to the external power supply terminal 101, a level shift circuit 170 and a CMOS circuit 180 having P-channel MOS transistors 181, 181' and 181" and N-channel MOS transistors 182, 182' and 182" and the power line being connected only to the output of the voltage converter 103.

The internal gates 120 (120') has two input terminals 121a (121a') and 121b (121b'), two P-channel MOS transistors 123a (123a') and 123b (123b'), four N-channel MOS transistors 124a (124a'), 124b (124b'), 125a (125a') and 125b (125b'), two NPN bipolar transistors 127 (127') and 128 (128'), a resistor 126 (126') and an output terminal 122 (122'). The sources of the P-channel MOS transistors 123a and 123b are connected to the output of the voltage converter 103. The collector of the NPN bipolar transistor 127 is connected to the external power supply terminal 101. This internal gate is the same NAND circuit as the one shown in FIG. 3.

The output buffer 130 is the inverter as shown in FIG. 1, the buffer 130 having a P-channel MOS transistor 133, N-channel MOS transistors 134 and 135, a resistor 136 and NPN transistors 137 and 138, the source of the P-channel MOS transistor 133 being connected t the output of the voltage converter 103 and the collector of the NPN transistor 137 being connected to the external power supply terminal 101. The data-bus driver 140 is the inverter as shown in FIG. 1, the driver 140 having a P-channel MOS transistor 143, N-channel MOS transistors 144 and 145, a resistor 146 and NPN transistors 147 and 148, the source of the P-channel MOS transistor 143 being connected to the output of the voltage converter 103 and the collector of the NPN transistor 147 being connected to the external power supply terminal 101. The signals processed in the Bi-CMOS circuit 104 is outputted to the output terminal 110 by the output buffer 130. By the data-bus buffer 140, other signals are outputted from the output terminal 122' of the internal gate 120' to the input terminal 151 151' of the Bi-CMOS circuit 150 and 150' and the gates of the MOS transistors 181" and 182" of the CMOS circuit 180 through the data-bus 113 having the parasitic capacitors 111 and 112.

The CMOS circuit 150 (150') also has the inverter as shown in FIG. 1. This inverter has a P-channel MOS transistors 153 (153'), N-channel MOS transistors 154 (154') and 155 (155'), a register 156 (156') and the NPN transistors 157 (157') and 158 (158'), the source of the P-channel MOS transistor 153 (153') being connected to the output of the voltage converter 103 and the collector of the NPN transistor 157 (157') being connected to the external power supply terminal 101.

In the Bi-CMOS circuits 104 and 150 (150'), since the power for the CMOS circuits is supplied by the voltage converter 103 which converts the external power voltage of 5 V to the internal power voltage of 3.3 V, the logic amplitude in the Bi-CMOS circuits 104, 150 and 150' is small, resulting in the low power consumption. Since the power for the NPN bipolar transistors 127 (127'), 137, 147 and 157 (157') is supplied from the external power supply through the external power supply terminal 101, the cut-off frequency $f_T$ is held at high and the collector current $I_C$ is large, resulting in a high speed operation and the large driving ability. Moreover, even if the internal gates 120, 120' the output buffer 130 and the data-bus driver 140 are switched simultaneously, the voltage converter 103 which supplies the power to the CMOS circuit without supplying the power to the bipolar circuit does not show the instability.

(10th embodiment)

Figure 11:
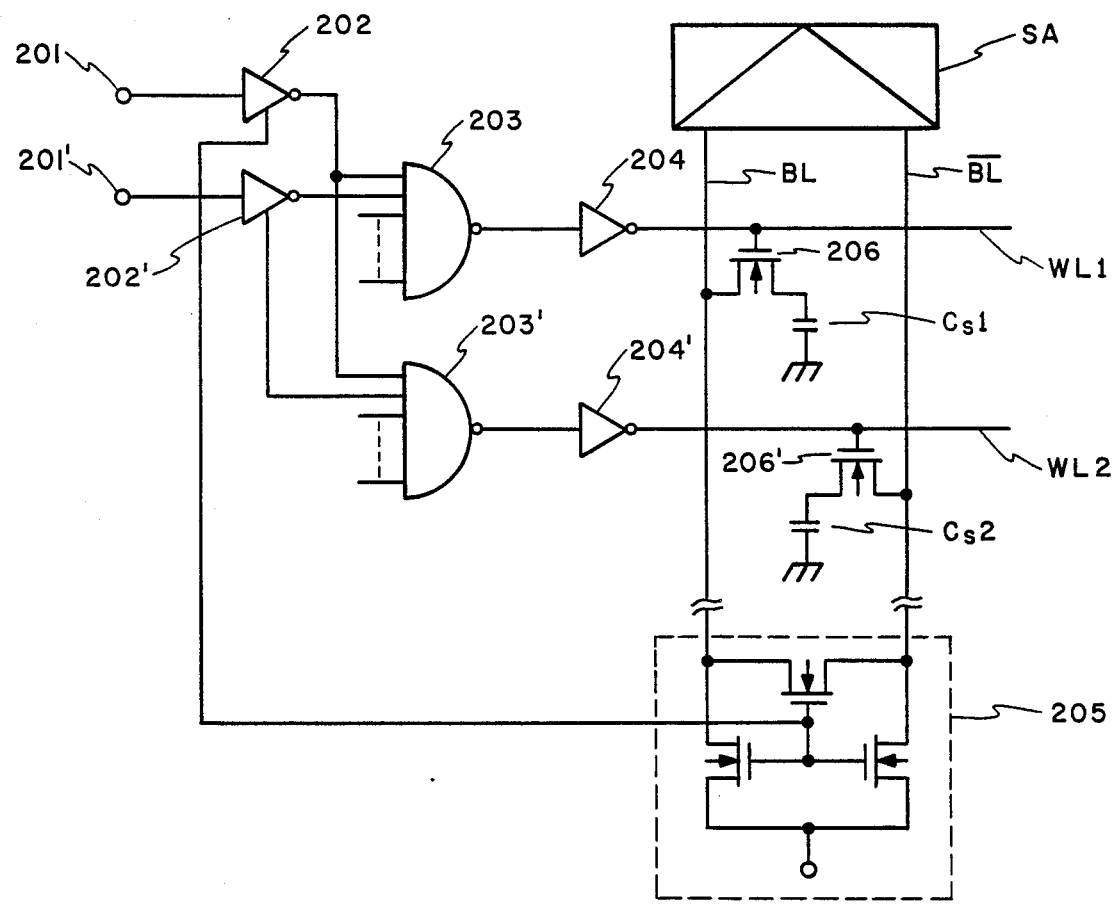
FIG. 11 is a circuit diagram of a dynamic random access memory (DRAM) for explaining the tenth embodiment of the present embodiment.
Figure 12:
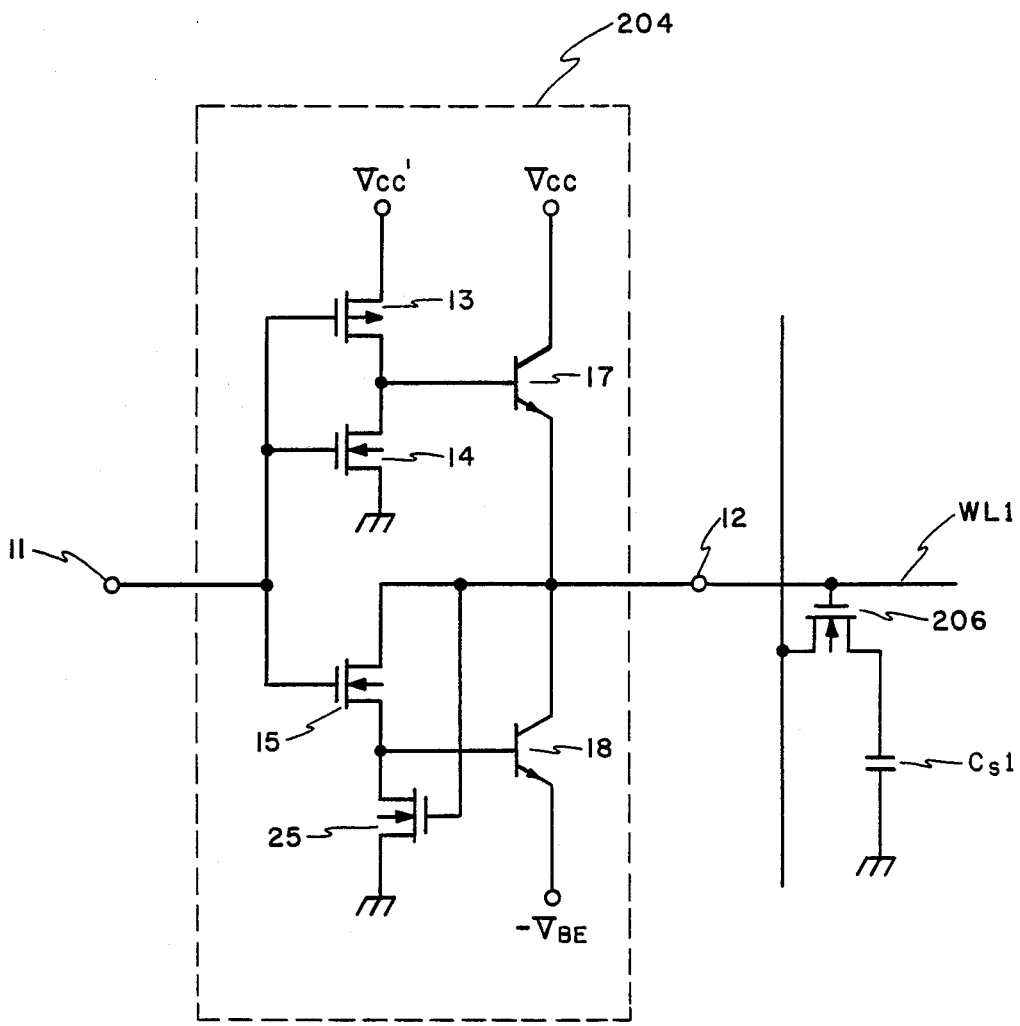
FIG. 12 is a circuit diagram showing the word line driver circuit used in the DRAM shown in FIG. 11.

Referring to FIG. 11, a DRAM circuit is constructed with address input terminals 201, 201', address buffers 202, 202', decoders 203, 203', word line drivers 204, 204', a sense amplifier SA, bit lines BL, $\overline{BL}$ word lines WL1, WL2, memory cells with N-channel MOS transistors 206, 206' and memory cell capacitors Cs1, Cs2, and a precharge circuit 205. Referring to FIG. 12, the word line driver circuit 204 is constructed with the inverter shown in FIG. 4. The collector of the NPN transistor 17 is connected to an external power source Vcc of 5 V, the source of the P-channel MOS transistor 13 being connected to an internal power source V'cc of 3.3 V supplied by an internal power converter. The emitter of the NPN transistor 18 is connected to an power source of $-V_{BE}$ to make the low logic level at the output terminal 12 0 V.

(11th embodiment)

Figure 13:
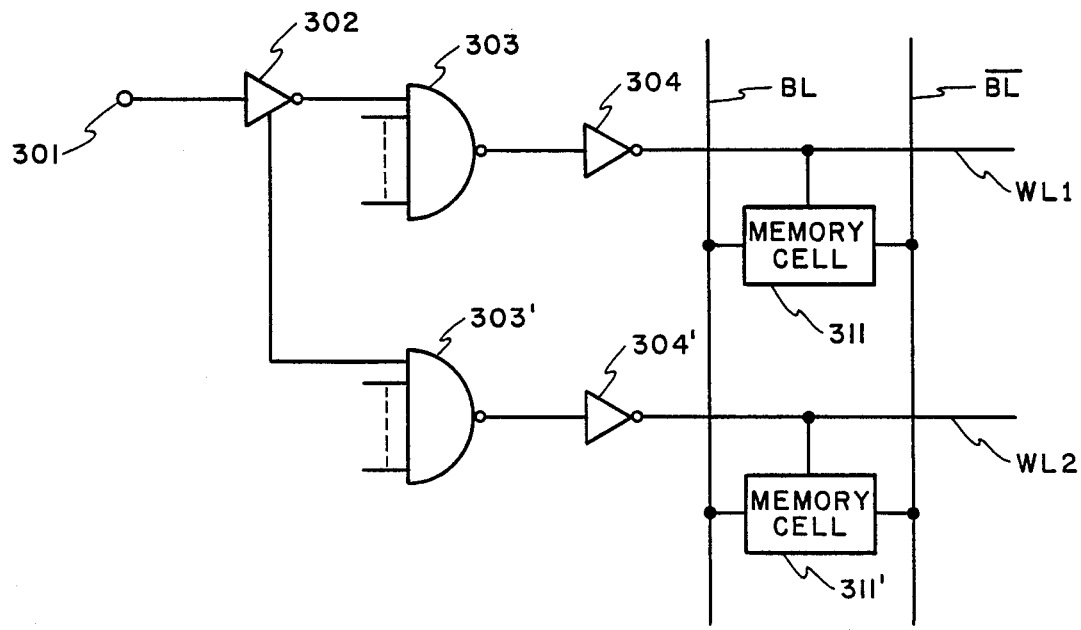
FIG. 13 is a circuit diagram of a static random access memory (SRAM) for explaining the eleventh embodiment of the present embodiment.

Referring to FIG. 13, an SRAM circuit is constructed with an address input terminal 301, an address buffer 302, decoders 303, 303', word line drivers 304, 304', memory cells 311, 311', word lines WL1, WL2 and bit lines BL and $\overline{BL}$.

Figure 14:
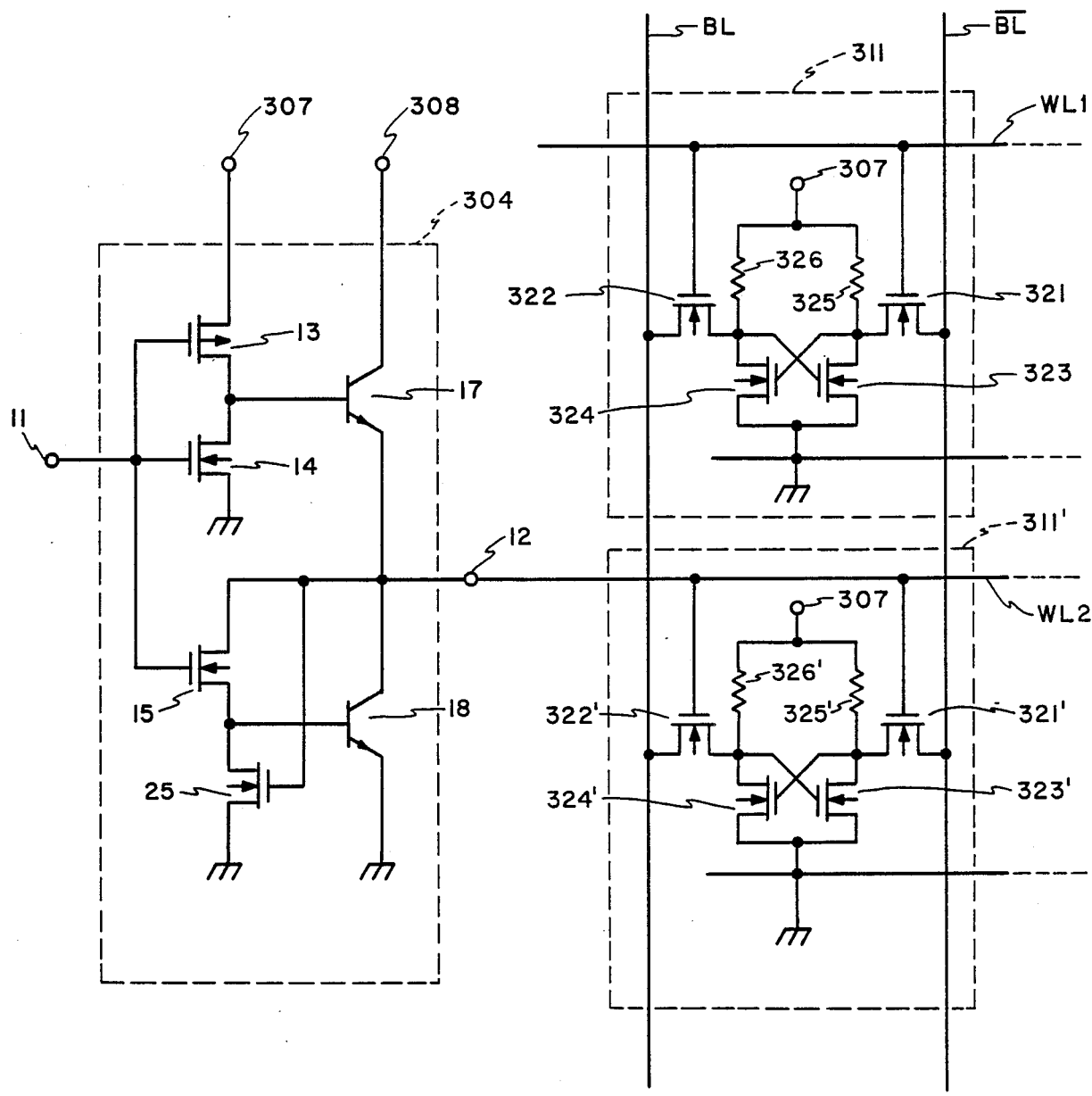
FIG. 14 is a circuit diagram of the word line driver circuit and the memory cell used in the SRAM shown in FIG. 13.

Referring to FIG. 14, the word line driver 304 is constructed with the inverter shown in FIG. 4.

The collector of the NPN transistor 17 is connected to an external power source 308 of 5 V, the source of the P-channel MOS transistor 13 being connected to an internal power source 307 of 3.3 V supplied by an internal power converter (not shown). Since the emitter of the NPN transistor 18 is connected to the ground, the low level at the output terminal 12 of this inverter is higher than the ground potential by the base-emitter built-in potential $V_{BE}$ of about 0.7 V. The memory cell 311 is constructed with N-channel MOS transistors 321, 322, 323 and 324 and the resistors 325 and 326, these resistors 325 and 326 being connected to an internal power source 307 of 3.3 V.

Figure 15:
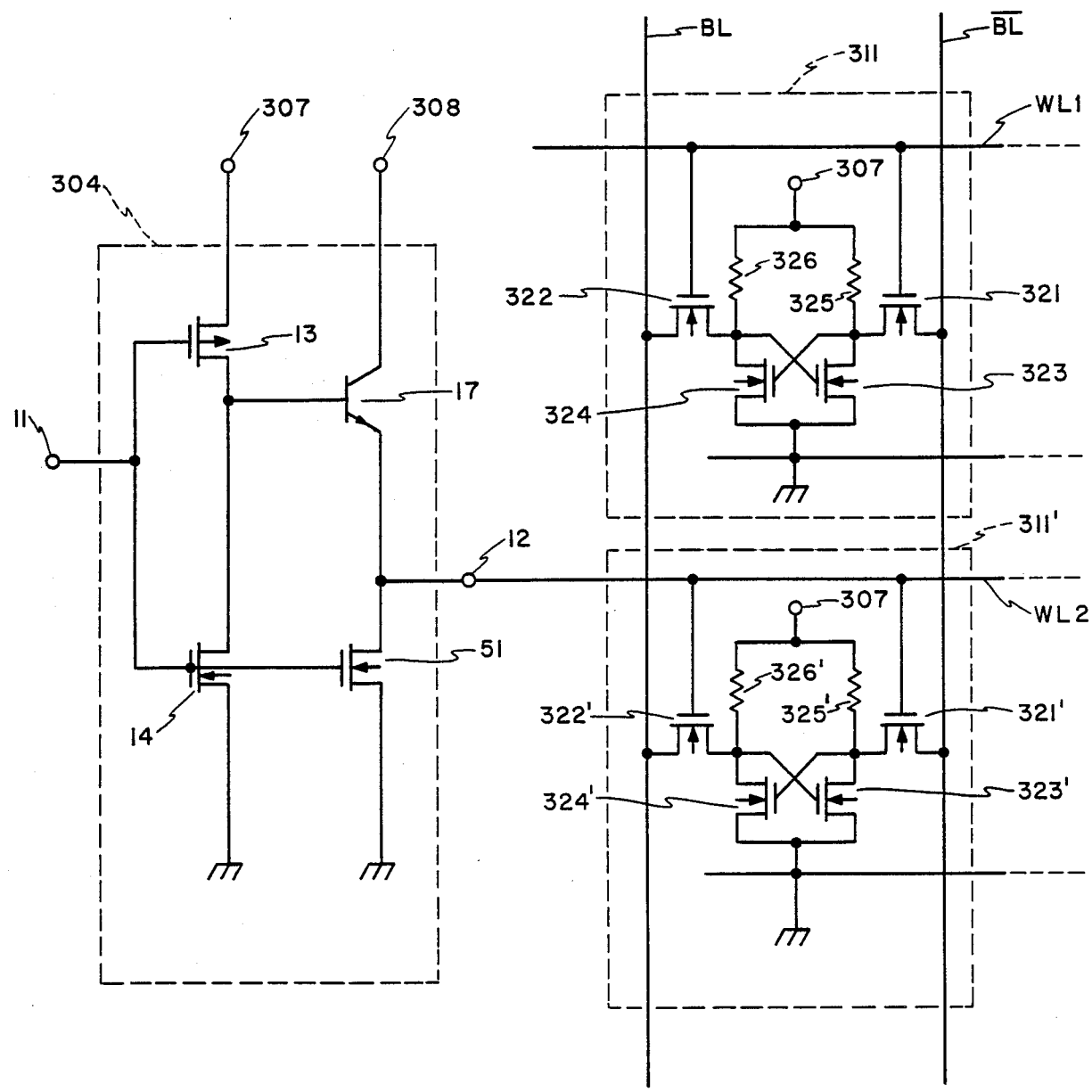
FIG. 15 is another circuit diagram of the word line driver circuit and the memory cell used in the SRAM shown in FIG. 13.

Referring to FIG. 15, the word line driver 304 is constructed with the inverter shown in FIG. 7. The collector of the NPN transistor 17 is connected to the external power source 308 of 5 V, the source of the P-channel MOS transistor 13 is connected to the internal power source 307 of 3.3 V supplied by an internal power converter (not shown). Since the N-channel MOS transistor 51 is used in place of the NPN transistor 18 shown in FIG. 14, the low level at the output terminal 12 is lowered to the ground level, resulting in a large logic amplitude from the low level to the high level at the output terminal 12.

What is claimed is:

1. A Bi-CMOS NAND circuit comprising:
   a first input terminal;
   a second input terminal;
   an output terminal;
   a first fixed potential source;
   a second fixed potential source supplying a potential higher than said first fixed potential source;
   a third fixed potential source having another potential between said first fixed potential and said second fixed potential;
   a first NPN bipolar transistor and a second NPN bipolar transistor connected in series between said first fixed potential source and said second fixed potential source, a collector of said first NPN bipolar transistor being connected to said second fixed potential source, an emitter of said first NPN transistor and a collector of said second NPN transistor being connected to said output terminal and a emitter of said second NPN transistor being connected to said first fixed potential source;
   a first P-channel MOS transistor and a second P-channel MOS transistor connected in parallel between said third fixed potential source and a base of said first NPN bipolar transistor, one of a source and a drain of said first P-channel MOS transistor and one of a source and a drain of said second P-channel MOS transistor being connected to said third fixed potential source, the other of the source and the drain of said first P-channel MOS transistor and the other of the source and the drain of said second P-channel MOS transistor being connected to the base of said first NPN bipolar transistor, a gate of said first P-channel MOS transistor being connected to said first input terminal and a gate of said second P-channel MOS transistor being connected to said second input terminal;
   a first N-channel MOS transistor and a second N-channel MOS transistor connected in series between said first fixed potential source and the base of said first NPN bipolar transistor, one of a source and a drain of said first N-channel MOS transistor being connected to the base of said first NPN transistor, the other of the source and the drain of said first P-channel MOS transistor and the other of the source and the drain of said second P-channel MOS transistor, the other of the source and the drain of said first N-channel MO transistor being connected to one of a source and a drain of said second N-channel MOS transistor, the other of the source and the drain of said second N-channel MOS transistor being connected to said first fixed potential source, a gate of said first N-channel MOS transistor being connected to said first input terminal and the gate of said first P-channel MOS transistor and a gate of said second N-channel MOS transistor being connected to said second input terminal and the gate of said second P-channel MOS transistor;
   a resistor; and
   a third N-channel MOS transistor and a fourth N-channel MOS transistor connected in series between said output terminal and the base of said second NPN bipolar transistor, one of a source and a drain of said third N-channel MOS transistor being connected to said output terminal, the emitter of said first NPN transistor and the collector of said second NPN transistor, the other of the source and the drain of said third N-channel MOS transistor being connected to one of a source and a drain of said fourth N-channel MOS transistor, the other of the source and the drain of said fourth N-channel MOS transistor being connected to said first fixed potential source through said resistor and to the base of said second NPN bipolar transistor, a gate of said third N-channel MOS transistor being connected to said first input terminal, the gate of said first P-channel MOS transistor and the gate of said first N-channel MO transistor and a gate of said fourth N-channel MOS transistor being connected to said second input terminal, the gate of said second P-channel MOS transistor and the gate of said second N-channel MOS transistor.

2. A Bi-CMOS NAND circuit comprising:
   a first input terminal;
   a second input terminal;
   an output terminal;
   a first fixed potential source;
   a second fixed potential source supplying a potential higher than said first fixed potential source;
   a third fixed potential source supplying another potential between said first fixed potential source and said second fixed potential source;
   an NPN bipolar transistor having a collector connected to said second fixed potential source, an emitter connected to said output terminal and a base;
   a first N-channel MOS transistor and a second N-channel MOS transistor connected in series between said output terminal and said first fixed potential source, one of a source and a drain of said first N-channel MOS transistor being connected to said output terminal and the emitter of said NPN bipolar transistor, the other of the source and the drain of said first N-channel MOS transistor being connected to one of a source and a drain of said second N-channel MOS transistor, the other of the source and the drain of said second N-channel MOS transistor being connected to said first fixed potential source, a gate of said first N-channel MOS transistor being connected to said first input terminal and a gate of said second N-channel MOS transistor being connected to said second input terminal;
   a first P-channel MOS transistor and a second P-channel MOS transistor connected in parallel between said third fixed potential source and the base of said NPN transistor, one of a source and a drain of said first P-channel MOS transistor and one of a source and a drain of said second P-channel MO transistor being connected to said third fixed potential source, the other of the source and the drain of said first P-channel MOS transistor and the other of the source and the drain of said second P-channel MOS transistor being connected to the base of said NPN bipolar transistor, a gate of said first P-channel MOS transistor being connected to said first input terminal and the gate of said first N-channel MOS transistor and a gate of said second P-channel MOS transistor being connected to said second input terminal and the gate of said second N-channel MOS transistor; and a third N-channel MOS transistor and a fourth N-channel MOS transistor being connected in series between the base of said NPN transistor and said first fixed potential source, one of a source and a drain of said third N-channel MOS transistor being connected to the base of said NPN transistor, the other of the source and the drain of said first P-channel MOS transistor and the other of the source and the drain of said second P-channel MOS transistor, the other of the source and the drain of said third N-channel MOS transistor being connected to one of a source and a drain of said fourth N-channel MOS transistor, the other of the source and the drain of said fourth N-channel MOS transistor being connected to said first fixed potential source, a gate of said third MOS transistor being connected to said first input terminal, the gate of said first N-channel MOS transistor and the gate of said first P-channel MOS transistor and a gate of said fourth N-channel MOS transistor being connected to said second input terminal, the gate of said second N-channel MOS transistor and the gate of said second P-channel MOS transistor.

3. A Bi-CMOS NOR circuit comprising:
a first input terminal;
a second input terminal;
an output terminal;
a first fixed potential source;
a second fixed potential source supplying a potential higher than said first fixed potential source;
a third fixed potential source supplying another potential between said first fixed potential source and said second fixed potential source;
an NPN bipolar transistor having a collector connected to said second fixed potential source, an emitter connected to said output terminal and a base;
a first N-channel MOS transistor and a second N-channel MOS transistor connected in parallel between said output terminal and said first fixed potential source, one of a source and a drain of said first N-channel MOS transistor and one of a source and a drain of said second N-channel MOS transistor being connected to said output terminal and the emitter of said NPN transistor, the other of the source and the drain of said first N-channel MOS transistor and the other of the source and the drain of said second N-channel MOS transistor being connected to said first fixed potential source, a gate of said first N-channel MOS transistor being connected to said first input terminal and a gate of said second N-channel MOS transistor being connected to said second input terminal;
a first P-channel MOS transistor and a second P-channel MOS transistor connected between said third fixed potential source and the base of said NPN transistor, one of a source and a drain being connected to said third fixed potential source, the other of the source and the drain of said first P-channel MOS transistor being connected to one of a source and a drain of said second P-channel MOS transistor, the other of the source and the drain of said second P-channel MOS transistor being connected to the base of said NPN bipolar transistor, a gate of said first P-channel MOS transistor being connected to said first input terminal and the gate of said first N-channel MOS transistor and a gate of said second P-channel MOS transistor being connected said second input terminal and the gate of said second N-channel MOS transistor; and a third N-channel MOS transistor and a fourth N-channel MOS transistor connected in parallel between the base of said NPN transistor and said first fixed potential source, one of a source and a drain of said third N-channel MOS transistor and one of a source and a drain of said fourth N-channel MOS transistor being connected to the base of said NPN bipolar transistor and the other of the source and the drain of said second P-channel MOS transistor, the other of the source and the drain of said third N-channel MOS transistor and the other of the source and the drain of said fourth N-channel MOS transistor being connected to said first fixed potential source, a gate of said third N-channel MOS transistor being connected to said first input terminal, the gate of said first P-channel MOS transistor and the gate of said first N-channel MOS transistor and a gate of said fourth N-channel MOS transistor being connected to said second input terminal, the gate of said second P-channel MOS transistor and the gate of said second N-channel MO transistor.

4. A Bi-MOS circuit comprising:
an input terminal;
an output terminal;
a first power voltage line held at a first power voltage;
a second power voltage line held at a second power voltage which is lower than said first power voltage;
a reference voltage line;
a first bipolar transistor of one polarity having a collector connected to said first power voltage line, an emitter connected to said output terminal and a base;
a second bipolar transistor of said one polarity having a collector connected to said output terminal and to said emitter of said first bipolar transistor, an emitter connected to said reference voltage line and a base;
a load element;
a first MOS transistor of one channel type having a source, a drain and a gate, one of said source and said drain being connected to said second power voltage line through said load element and to said base of said first bipolar transistor, the other of said source and said drain being connected to said reference line, and said gate being connected to said input terminal;
a second MOS transistor of said one channel type having a source, a drain and a gate, said of said second MOS transistor being connected to said input terminal and to said gate of said first MOS transistor, one of said source and said drain of said second MOS transistor being connected to said output terminal, to said emitter of said first bipolar transistor and to said collector of said second bipolar transistor, and the other of said source and said drain of said second MOS transistor being connected to said base of said second bipolar transistor; and a third MOS transistor of said one channel type having a source, a drain and a gate, said gate of said third MOS transistor being connected to said output terminal, to said one of said source and said drain of said second MOS transistor, to said emitter of said first bipolar transistor and to said collector of said second bipolar transistor, one of said source and said drain of said third MOS transistor being connected to the other of said source and said drain of said second MOS transistor, and the other of said source and said drain of said third being connected to said reference voltage line.

5. A Bi-MOS circuit comprising:
an input terminal;
an output terminal;
a first power voltage line held at a first power voltage;
a second power voltage line held at a second power voltage which is lower than said first power voltage;
a reference voltage line;
a first NPN bipolar transistor having a collector connected to said first power voltage line, an emitter connected to said output terminal and a base;
a second NPN bipolar transistor having a collector connected to said output terminal and to said emitter of said first NPN bipolar transistor, an emitter connected to said reference voltage line and a base;
a first P-channel MOS transistor having a source, a drain and a gate, one of said source and said drain of said first P-channel MOS transistor being connected to said second power voltage line and the other of said source and said drain of said first P-channel MOS transistor being connected to said base of said first NPN bipolar transistor;
a first N-channel MOS transistor having a source, a drain and a gate, one of said source and said drain of said first N-channel MOS transistor being connected to said base of said first NPN bipolar transistor and to the other of said source and said drain of said first P-channel MOS transistor, and the other of said source and said drain of said first N-channel MOS transistor being connected to said reference voltage line;
a first resistor;
a second N-channel MOS transistor having a source, a drain and a gate, one of said source and said drain of said second N-channel MOS transistor being connected to said output terminal, to said emitter of said first NPN bipolar transistor and to said collector of said second NPN bipolar transistor and the other of said source and said drain of said second N-channel MOS transistor being connected to said reference voltage line through said first resistor;
a second P-channel MOS transistor having a source, a drain and a gate, one of said source and said drain of said second P-channel MOS transistor being connected to said second power voltage line and the other of said source and said drain of said second P-channel MOS transistor being connected to said gate of said first P-channel MOS transistor, to said gate of said first N-channel MOS transistor and to said gate of said second N-channel MOS transistor;

a third N-channel MOS transistor having a source, a drain and a gate, one of said source and said drain of said third N-channel MOS transistor being connected to the other of said source and said drain of said second P-channel MOS transistor, to said gate of said first P-channel MOS transistor, to said gate of said first N-channel MOS transistor and to said gate of said second N-channel MOS transistor, and the other of said source and said drain of said third N-channel MOS transistor being connected to said reference voltage line;
a second resistor having a first terminal and a second terminal, said first terminal being connected to said first power voltage line and said second terminal being connected to said gate of said second P-channel MOS transistor and to said gate of said third N-channel MOS transistor; and
a third NPN bipolar transistor having a collector connected to said second terminal of said second resistor, to said gate of said second P-channel MOS transistor and to said gate of said third N-channel MOS transistor, an emitter connected to said reference voltage line and a base connected to said input terminal.

6. A Bi-MOS circuit comprising:
a first input terminal;
a second input terminal;
an output terminal;
a first power voltage line held at a first power voltage;
a second power voltage line held at a second power voltage which is lower than said first power voltage;
a reference voltage line;
a first NPN bipolar transistor having a collector connected to said first power voltage line, an emitter connected to said output terminal and a base; p1 a second NPN bipolar transistor having a collector connected to said output terminal and to said emitter of said first NPN bipolar transistor, an emitter connected to said reference voltage line and a base;
a first P-channel MOS transistor having a source, a drain and a gate, one of said source and said drain of said first P-channel MOS transistor being connected to said second power voltage line, the other of said source and said drain of said first P-channel MOS transistor being connected to said base of said first NPN bipolar transistor, and said gate of said first P-channel MOS transistor being connected to said first input terminal;
a second P-channel MOS transistor having a source, a drain and a gate, one of said source and said drain of said second P-channel MOS transistor being connected to said second power voltage line, the other of said source and said drain of said second P-channel MOS transistor being connected to said base of said first NPN bipolar transistor and to the other of said source and said drain of said first P-channel MOS transistor, and said gate of said second P-channel MOS transistor being connected to said second input terminal;
a first N-channel MOS transistor having a source, a drain and a gate, one of said source and said drain of said first N-channel MOS transistor being connected to said base of said first NPN bipolar transistor, to the other of said source and said drain of said first P-channel MOS transistor and to the other of said source and said drain of said second P-channel MOS transistor, and said gate of said first N-channel MOS transistor being connected to said first input terminal and to said gate of said first P-channel MOS transistor;

a second N-channel MOS transistor having a source, a drain and a gate, one of said source and said drain of said second N-channel MOS transistor being connected to the other of said source and said drain of said first N-channel MOS transistor, the other of said source and said drain of said second N-channel MOS transistor being connected to said reference voltage line, and said gate of said second N-channel MOS transistor being connected to said second input terminal and to said gate of said second P-channel MOS transistor;

a third N-channel MOS transistor having a source, a drain and a gate, one of said source and said drain of said third N-channel MOS transistor being connected to said output terminal, to said emitter of said first NPN bipolar transistor and to said collector of said second NPN bipolar transistor, and said gate of said third N-channel MOS transistor being connected to said first input terminal, to said gate of said first P-channel MOS transistor and to said gate of said first N-channel MOS transistor;

a resistor; and a fourth N-channel MOS transistor having a source, a drain and a gate, one of said source and said drain of said fourth N-channel MOS transistor being connected to the other of said source and said drain of said third N-channel MOS transistor, the other of said source and said drain of said fourth N-channel MOS transistor being connected to said reference voltage line through said resistor and to said base of said second NPN bipolar transistor, and said gate of said fourth N-channel MOS transistor being connected to said second input terminal, to said gate of said second P-channel MOS transistor and to said gate of said second N-channel MOS transistor.

7. A Bi-MOS circuit comprising
a first input terminal;
a second input terminal;
an output terminal;
a first power voltage line held at a first power voltage;
a second power voltage line held at a second power voltage which is lower than said first power voltage;
a reference voltage line;
a NPN bipolar transistor having a collector connected to said first power voltage line, an emitter connected to said output terminal and a base;
a first N-channel MOS transistor having a source, a drain and a gate, one of said source and said drain being connected to said output terminal and to said emitter of said NPN bipolar transistor, and said gate of said first N-channel MOS transistor being connected to said first input terminal;
a second N-channel MOS transistor having a source, a drain and a gate, one of said source and said drain of said second N-channel MOS transistor being connected to the other of said source and said drain of said first N-channel MOS transistor, the other of said source and said drain of said second N-channel MOS transistor being connected to said reference voltage line, and said gate of said second N-channel MOS transistor being connected to said second input terminal;

a first P-channel MOS transistor having a source, a drain and a gate, one of said source and said drain of said first P-channel MOS transistor being connected to said second power voltage line, the other of said source and said drain of said first P-channel MOS transistor being connected to said base of said NPN bipolar transistor, and said gate of said first P-channel MOS transistor being connected to said first input terminal and to said gate of said first N-channel MOS transistor;

a second P-channel MOS transistor having a source, a drain and a gate, one of said source and said drain of said second P-channel MOS transistor being connected to said second power voltage line, the other of said source and said drain of said second P-channel MOS transistor being connected to said base of said NPN bipolar transistor and to the other of said source and of said second P-channel MOS transistor being connected to said second input terminal and to said gate of said second N-channel MOS transistor;

a third N-channel MOS transistor having a source, a drain and a gate, one of said source and said drain of said third N-channel MOS transistor being connected to said base of said NPN bipolar transistor, to the other of said source and said drain of said first P-channel MOS transistor and to the other of said source and said drain of said second P-channel MOS transistor, and said gate of said third N-channel MOS transistor being connected to said first input terminal, to said gate of said first N-channel MOS transistor and to said gate of said first P-channel MOS transistor; and a fourth N-channel MOS transistor having a source, a drain and a gate, one of said source and drain of said fourth N-channel MOS transistor being connected to the other of said source and said drain of said third N-channel MOS transistor, the other of said source and said drain being connected to said reference voltage line, and said gate of said fourth N-channel MOS transistor being connected to said second input terminal, to said gate of said second N-channel MOS transistor and to said gate of said second P-channel MOS transistor.

8. A Bi-MOS circuit comprising:
a first input terminal;
a second input terminal
an output terminal;
a first power voltage line held at a first power voltage;
a second power voltage line held at a second power voltage which is lower than said first power voltage;
a reference voltage line;
an NPN bipolar transistor having a collector connected to said first power voltage line, an emitter connected to said output terminal and a base;
a first N-channel MOS transistor having a source, a drain and a gate, one of said source and said drain of said first N-channel MOS transistor being connected to said output terminal and to said emitter of said NPN bipolar transistor, the other of said source and said drain of said first N-channel MOS transistor being connected to said reference voltage line, and said gate of said first N-channel MOS transistor being connected to said first input terminal;

a second N-channel MOS transistor having a source, a drain and a gate, one of said source and said drain of said second N-channel MOS transistor being connected to said output terminal, to said emitter of said NPN bipolar transistor and to said one of said source and said drain of said first N-channel MOS transistor, the other of said source and said drain of said second N-channel MOS transistor being connected to said reference voltage line, and said gate of said second N-channel MOS transistor being connected to said second input terminal;

a first P-channel MOS transistor having a source, a drain and a gate, one of said source and said drain of said first P-channel MOS transistor being connected to said second power voltage line, and said gate of said first P-channel MOS transistor being connected to said first input terminal and to said gate of said first N-channel MOS transistor;

a second P-channel MOS transistor having a source, a drain and a gate, one of said source and said drain of said second P-channel MOS transistor being connected to the other of said source and said drain of said first P-channel MOS transistor, and said gate of said second P-channel MOS transistor being connected to said second input terminal and to said gate of said second N-channel MOS transistor;

a third N-channel MOS transistor having a source, a drain and a gate, one of said source and said drain of said third N-channel MOS transistor being connected to said base of said NPN bipolar transistor and to the other of said source and said drain of said second P-channel MOS transistor, the other of said source and said drain of said third N-channel MOS transistor being connected to said reference voltage line, and said gate of said third N-channel MOS transistor being connected to said first input terminal, to said gate of said first N-channel MOS transistor and to said gate of said first P-channel MOS transistor; and a fourth N-channel MOS transistor having a source, a drain and a gate, one of said source and said drain of said fourth N-channel MOS transistor being connected to said base of said NPN bipolar transistor, to said one of said source and said drain of said third N-channel MOS transistor to the other of said source and said drain of said second P-channel MOS transistor, the other of said source and said drain of said fourth N-channel MOS transistor being connected to said reference voltage line, and said gate of said fourth N-channel MOS transistor being connected to said second input terminal, to said gate of said second N-channel MOS transistor and to said gate of said second P-channel MOs transistor.

* * * * *